United States Patent
Tsai et al.

(10) Patent No.: US 10,720,581 B2
(45) Date of Patent: Jul. 21, 2020

(54) BARRIER LAYER FOR RESISTIVE RANDOM ACCESS MEMORY

(71) Applicant: Taiwan Semiconductor Manufacturing Co., Ltd., Hsinchu (TW)

(72) Inventors: Tzu Chung Tsai, Hsinchu County (TW); Yan-Chi Chen, Hsinchu County (TW); Hsia-Wei Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/229,345

(22) Filed: Dec. 21, 2018

(65) Prior Publication Data

US 2020/0136039 A1   Apr. 30, 2020

Related U.S. Application Data (60) Provisional application No. 62/752,468, filed on Oct. 30, 2018.

(51) Int. Cl.
*H01L 45/00* (2006.01)

(52) U.S. Cl.
CPC ...... *H01L 45/1253* (2013.01); *H01L 45/1616* (2013.01); *H01L 45/1675* (2013.01)

(58) Field of Classification Search
CPC .... H01L 45/085; H01L 45/1253; H01L 45/12
See application file for complete search history.

(56) References Cited

U.S. PATENT DOCUMENTS

| | | | |
|---|---|---|---|
| 10,164,169 B2 | 12/2018 | Chuang et al. | |
| 10,411,068 B2 | 9/2019 | Wiegand et al. | |
| 2016/0268506 A1* | 9/2016 | Huang | H01L 45/1253 |

FOREIGN PATENT DOCUMENTS

| | | |
|---|---|---|
| EP | 2202816 A1 | 6/2010 |
| TW | 201729441 A | 8/2017 |
| TW | 201814775 A | 4/2018 |
| WO | WO-2018009155 A1 | 1/2018 |

OTHER PUBLICATIONS

Office Action, dated Apr. 28, 2020, for Taiwanese Intellectual Property Office Appl. No. 108111047, 5 pages.

* cited by examiner

*Primary Examiner* — Changhyun Yi
(74) *Attorney, Agent, or Firm* — Sterne, Kessler, Goldstein & Fox P.L.L.C.

(57) ABSTRACT

The present disclosure is directed to resistive random access memory (RRAM) structures with a bottom electrode barrier stack. For example, the RRAM structure includes: (i) a bottom electrode having a conductive material and a layer stack, where the layer stack covers a bottom surface and a side surface of the conductive material and is interposed between the conductive material and an underlying conductive structure; (ii) a resistance-switching layer that is disposed on the bottom electrode and opposite to the conductive structure; and (iii) a top electrode that is disposed on the resistance-switching layer.

20 Claims, 9 Drawing Sheets

BARRIER LAYER FOR RESISTIVE RANDOM ACCESS MEMORY

CROSS-REFERENCE TO RELATED APPLICATION

This application claims the benefit of U.S. Provisional Patent Application No. 62/752,468, titled "Barrier Layer for Resistive Random Access Memory," which was filed on Oct. 30, 2018 and is incorporated herein by reference in its entirety.

BACKGROUND

In integrated circuits, resistive random-access memory (RRAM) structures can be formed in the back end of the line between layers of interconnect structures (e.g., lines and vias) that include a metal (e.g., copper) or a metal alloy (e.g., copper alloy). Discontinuities (e.g., cracks) in the barrier layers of RRAMs can lead to copper loss from the interconnect structures and can have detrimental effects on die yield.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of the value The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±20%, or ±30% of the value).

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances. Unless defined otherwise, technical and scientific terms used herein have the same meanings as commonly understood by one of ordinary skill in the art to which this disclosure belongs.

Resistive random-access memory (RRAM) is a non-volatile type of memory. An RRAM cell can store a bit of data using resistance, rather than electric charge. More specifically, the RRAM cell includes a resistive material layer, the resistance of which can be adjusted to represent a logic "0" or a logic "1." RRAMs operate under the principle that a dielectric material can be manufactured to conduct current via a "filament" or a conduction path formed after the application of a voltage across a pair of electrodes that surrounds the dielectric material. The conduction path can arise from different mechanisms, including vacancies in the dielectric material, metal defect migration, and/or other mechanisms. The formation of the filament, or the conduction path, is part of the "forming operation" or formation process (e.g., programming) of the RRAM cell. Once the filament or the conduction path is established, it may be reset ("broken," resulting in a higher resistance) or set ("reformed," resulting in a lower resistance) by another voltage. The low-resistance path can be either localized (e.g., limited to the area of the filament) or homogeneous (e.g., throughout the dielectric between the two electrodes).

RRAM structures can be integrated with (e.g., embedded in) complementary metal oxide semiconductor (CMOS) integrated circuits (ICs). These RRAM structures, also referred to as "embedded RRAM structures," are scaled down, much like other components in the CMOS IC—such as the transistors and the interconnects, to meet industry demand. As a result, barrier layers, which are interposed between bottom electrodes of RRAM structures and the conductive structures of an underlying interconnect layer, are also scaled down as the RRAM dimensions shrink. A side effect of barrier layer scaling is that the barrier layer may develop discontinuities at structural "weak-points," such as at the corners of the bottom electrode. Copper atoms from the underlying conductive structures can diffuse through these discontinuities and leave behind copper voids, thus compromising device operation.

The embodiments described herein are directed to RRAM structures with a bottom electrode barrier stack. According to some embodiments, the bottom electrode barrier stack includes a tantalum nitride/tantalum/tantalum nitride tri-layer stack or a titanium nitride/titanium/titanium nitride tri-layer stack. The bottom electrode barrier stack can be immune to the formation of discontinuities and/or provide improved barrier properties against copper diffusion as compared to a single barrier layer. Therefore, the barrier stack can suppress the formation of copper-voids in the conductive structures of underlying interconnect layers.

Figure 1:
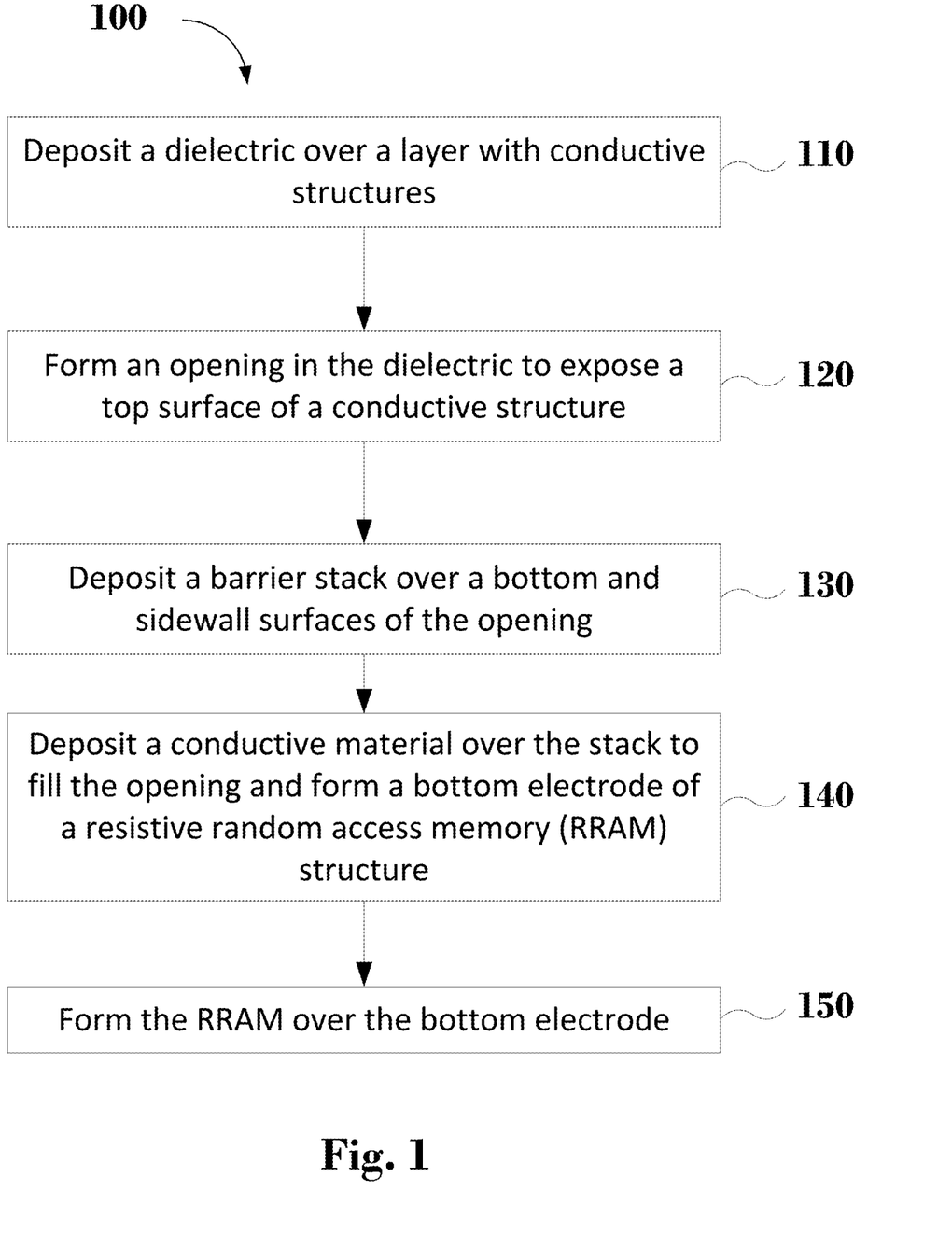
FIG. 1 illustrates a method for forming a bottom electrode barrier stack in a resistive random-access memory structure, according to some embodiments.

FIG. 1 is a flowchart of a fabrication method 100 for forming a bottom electrode barrier stack in a RRAM structure, according to some embodiments. This disclosure is not limited to this operational description and other operations are within the spirit and scope of the present disclosure. It is to be appreciated that additional operations may be performed. Moreover, not all operations may be needed to perform the disclosure provided herein. Additionally, some of the operations shown in FIG. 1 may be performed simultaneously or in a different order. In some embodiments, one or more other operations may be performed in addition to, or in place of, the presently described operations. For illustrative purposes, method 100 will be described with reference to the embodiments shown in FIGS. 2 through 9.

Figure 2:
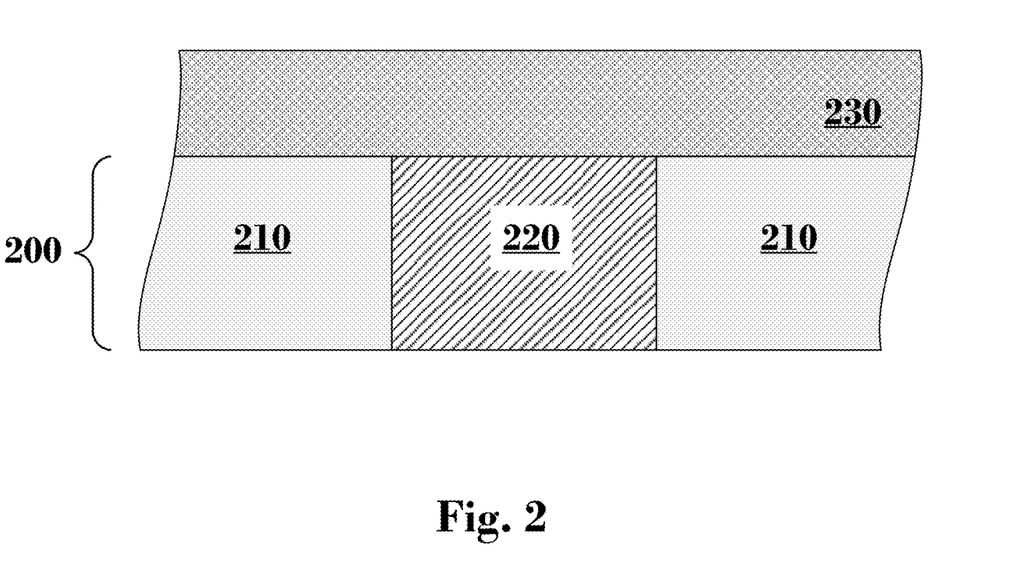
FIG. 2 illustrates a cross-sectional view of a dielectric layer over a layer with conductive structures, according to some embodiments.

Referring to FIG. 1, method 100 begins with operation 110 and the deposition of a dielectric over a layer with conductive structures. For example, FIG. 2 is a partial cross-sectional view of a dielectric 230 over a layer 200 with conductive structure 220. According to some embodiments, layer 200 can be a back end of the line (BEOL) metal interconnect layer that includes one or more conductive structure 220 embedded in a dielectric layer 210. By way of example and not limitation, layer 200 can be over other layers, not shown in FIG. 2 for simplicity. These other layers may include, for example, additional metallization layers with conductive structure—such as previously formed BEOL layers and/or middle of the line (MOL) layers over field effect transistors, diodes, capacitors, resistors, or combinations thereof, which are formed over a substrate (e.g., a silicon wafer, another semiconductor wafer, a semiconductor-on-insulator wafer, etc.). In some embodiments, conductive structure 220 can include vertical interconnect access (via) structures, lateral lines, other structures, or combinations thereof that are filled with a conductive material, such as copper, copper alloy, another metal or another alloy. In some embodiments, conductive structure 220 include a liner layer (not shown in FIG. 2 for simplicity) on which the conductive material is disposed. In some embodiments, the liner layer covers the sidewall and bottom surfaces of conductive structure 220 to prevent out-diffusion of metal atoms from conductive structure 220 to other layers under layer 200.

Dielectric layer 210 can be an interlayer dielectric (ILD) (e.g., a dielectric between adjacent layers), such as a dielectric with a dielectric constant value ("k-value") below about 3.9 (e.g., about 3.2, about 3.0, about 2.9, about 2.5, etc.). In some embodiments, dielectric layer 210 can be a stack of dielectrics such as, for example, a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; or (iv) a low-k dielectric (e.g., carbon doped silicon oxide) with silicon oxide. By way of example and not limitation, dielectric layer 210 can be deposited by a high-density chemical vapor deposition (HDCVD) process, a plasma-enhanced chemical vapor deposition process (PECVD), a plasma-enhanced atomic layer deposition process (PEALD), or any another suitable deposition process at a thickness between about 200 nm and about 100 nm. The aforementioned deposition thickness ranges, deposition methods, and materials are exemplary and not limiting. Therefore, other materials, deposition thickness ranges, and deposition methods are within the spirit and the scope of this disclosure.

In some embodiments, dielectric 230 includes a silicon carbide layer, a silicon oxy-nitride layer, a silicon oxide layer, or a silicon nitride layer with a thickness between about 5 nm and about 80 nm. By way of example and not limitation, dielectric 230 can be deposited with a CVD process, a PECVD process, a PEALD process, or any other suitable deposition process. In some embodiments, dielectric 230 serves as an etch stop layer during the fabrication of a RRAM structure or other memory structure on layer 200.

Figure 3:
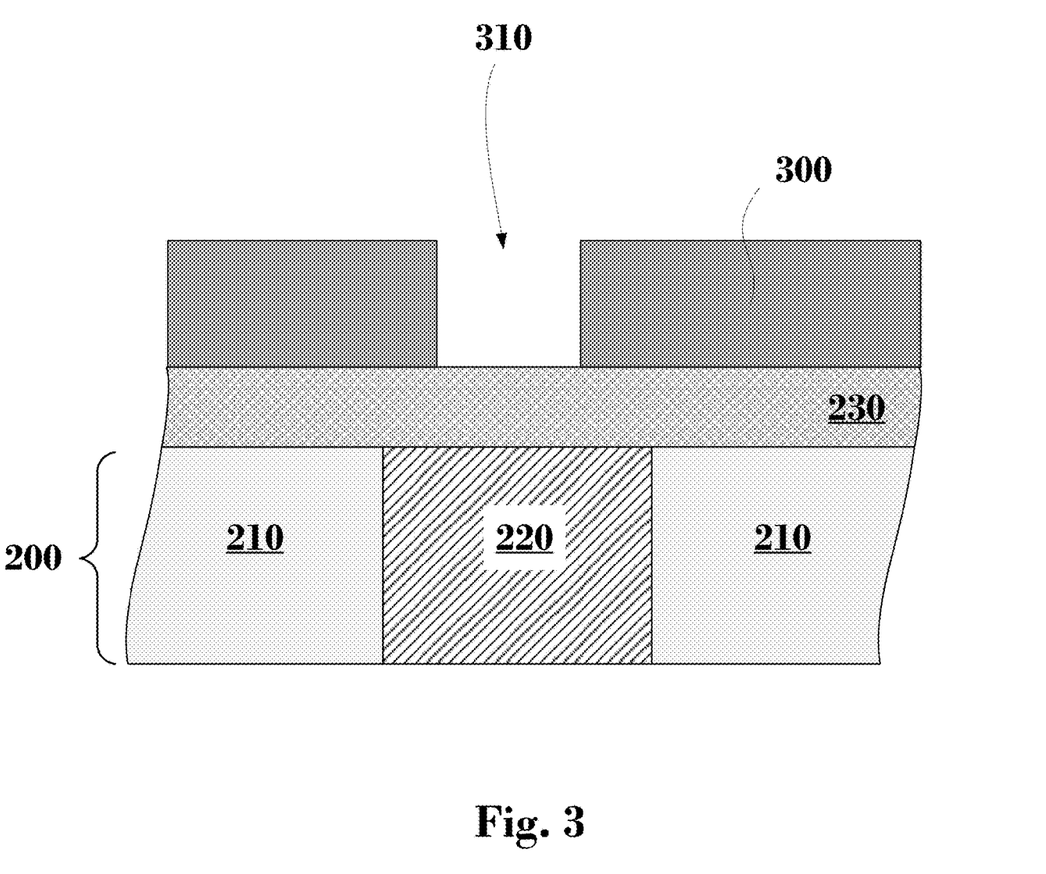
FIG. 3 illustrates a cross-sectional view of a dielectric layer over a layer with conductive structures after pattering a photoresist layer, according to some embodiments.

In referring to FIG. 1, method 100 continues with operation 120, where an opening is formed in dielectric 230 to expose a top surface of conductive structure 220. Referring to FIG. 3, a photoresist layer 300 can be disposed (e.g., spin coated) over dielectric 230. Subsequently, photoresist layer 300 can be patterned (e.g., by using a photo mask or reticle, photolithography, and etching operations) to form opening 310 that exposes a portion of underlying dielectric 230, as shown in FIG. 3. In some embodiments, opening 310 is aligned with conductive structure 220.

Figure 4:
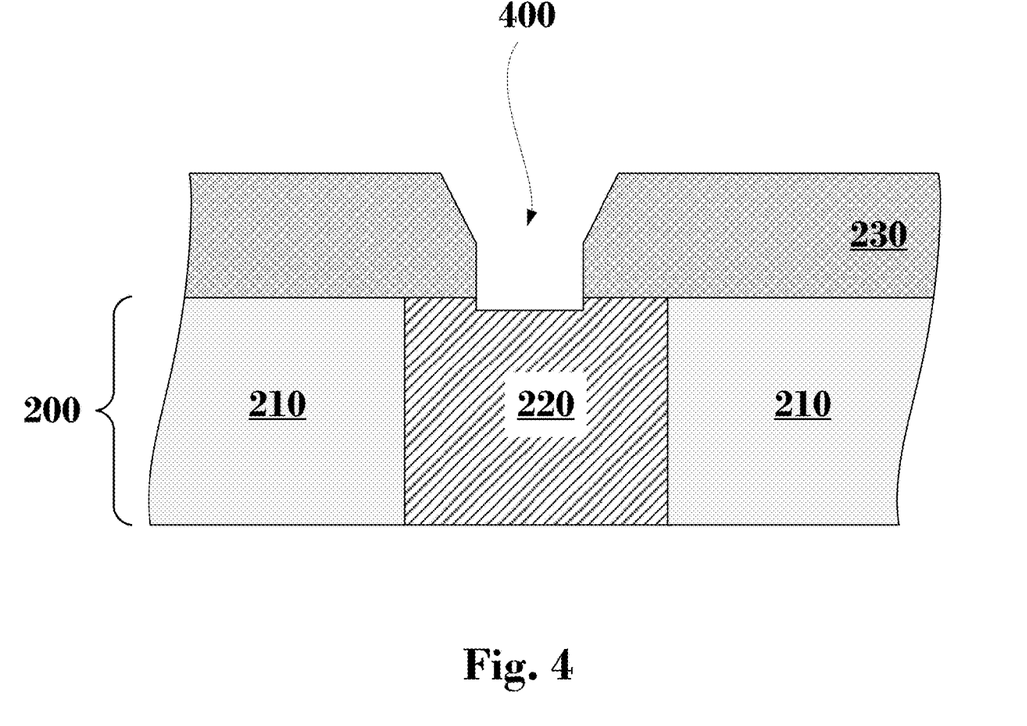
FIG. 4 illustrates a cross-sectional view of an opening formed in a dielectric layer to expose a conductive structure in an underlying layer, according to some embodiments.

In referring to FIG. 4, an etching operation, such as a dry etch, can remove exposed portions of dielectric 230 through opening 310 to form opening 400. Opening 400 exposes a portion of conductive structure 220. In some embodiments, the etching operation in dielectric 230 may include one or more etching sub-operations with a halogen-based etching chemistry, such as a fluorine-based chemistry, a chlorine-based chemistry, or combinations thereof to achieve the tapered profile of opening 400. By way of example and not limitation, a first etching sub-operation can form a top tapered profile of opening 400; and a second etching sub-operation—which can be more anisotropic from the first etching sub-operation—can form the vertical sidewalls of opening 400. Alternatively, a first etching sub-operation can form opening 400 with substantially vertical sidewalls, and a second etching sub-operation can induce a taper on the upper portion of opening 400. In some embodiments, the tapered profile of opening 400 in dielectric 230 can be the result of one or more photolithography operations followed by respective etching operations. Formation of opening 400 is not limited to the aforementioned examples and additional methods are within the spirit and the scope of this disclosure.

Regardless of the etching scheme used to form the shape of opening 400, the last etching sub-operation can over etch the exposed conductive structure 220 to ensure that conductive structure 220 is exposed and dielectric 230 has been removed from the bottom of opening 400. By way of example and not limitation, the aforementioned etching process can over etch conductive structure 220 by about 1.5 nm. In some embodiments, an aspect ratio of opening 400 can range from about 0.1 to about 0.6, where the aspect ratio is defined as the ratio of the width (e.g., bottom width) of opening 400 to the height of opening 400. The aforementioned dimensions and over etch values for opening 400 and conductive structure 220 are exemplary and not limiting. Therefore, other dimensions for opening 400 and over etch values for conductive structure 220 are within the spirit and the scope of this disclosure. After the formation of opening 400 in dielectric 230, the patterned photoresist layer 300 (shown in FIG. 3) that was used for the formation of opening 400 can be removed with a wet etching process, a dry etching process, combinations thereof, or another suitable photoresist removal process.

Figure 5:
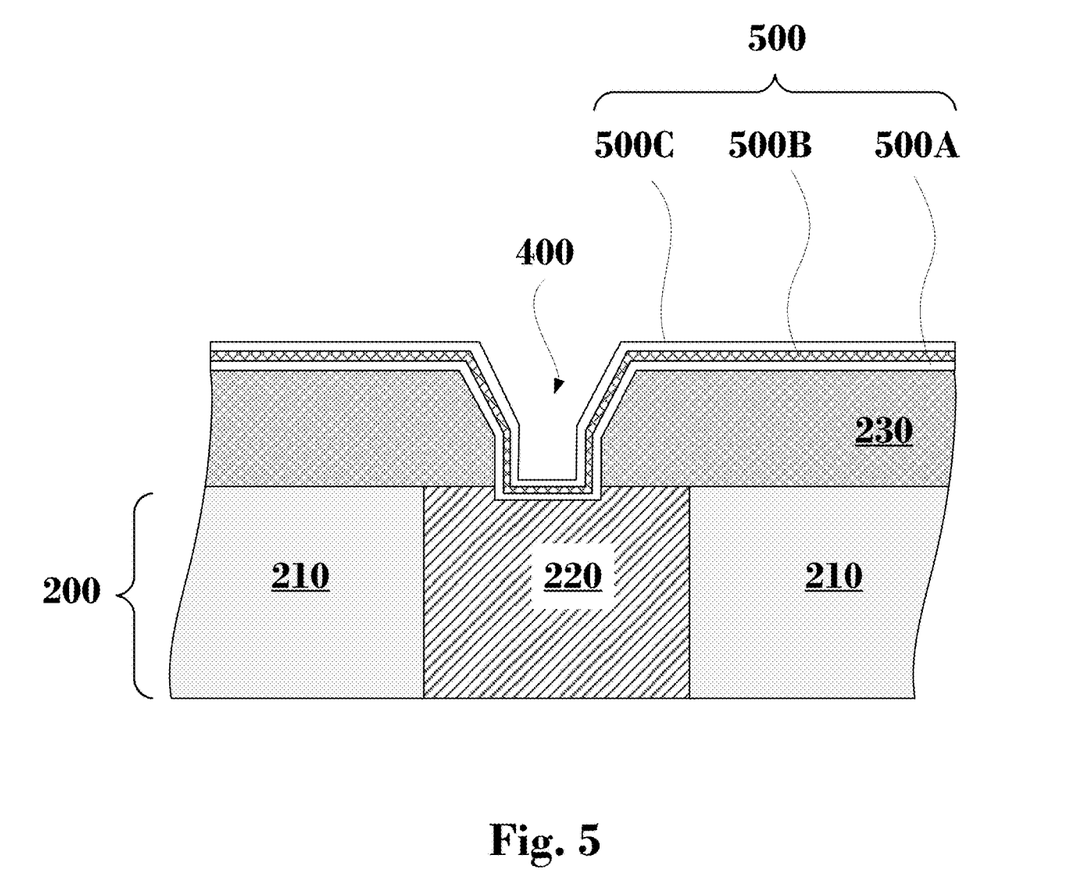
FIG. 5 illustrates a cross-sectional view of a barrier stack disposed in an opening over a conductive structure, according to some embodiments.
Figure 6:
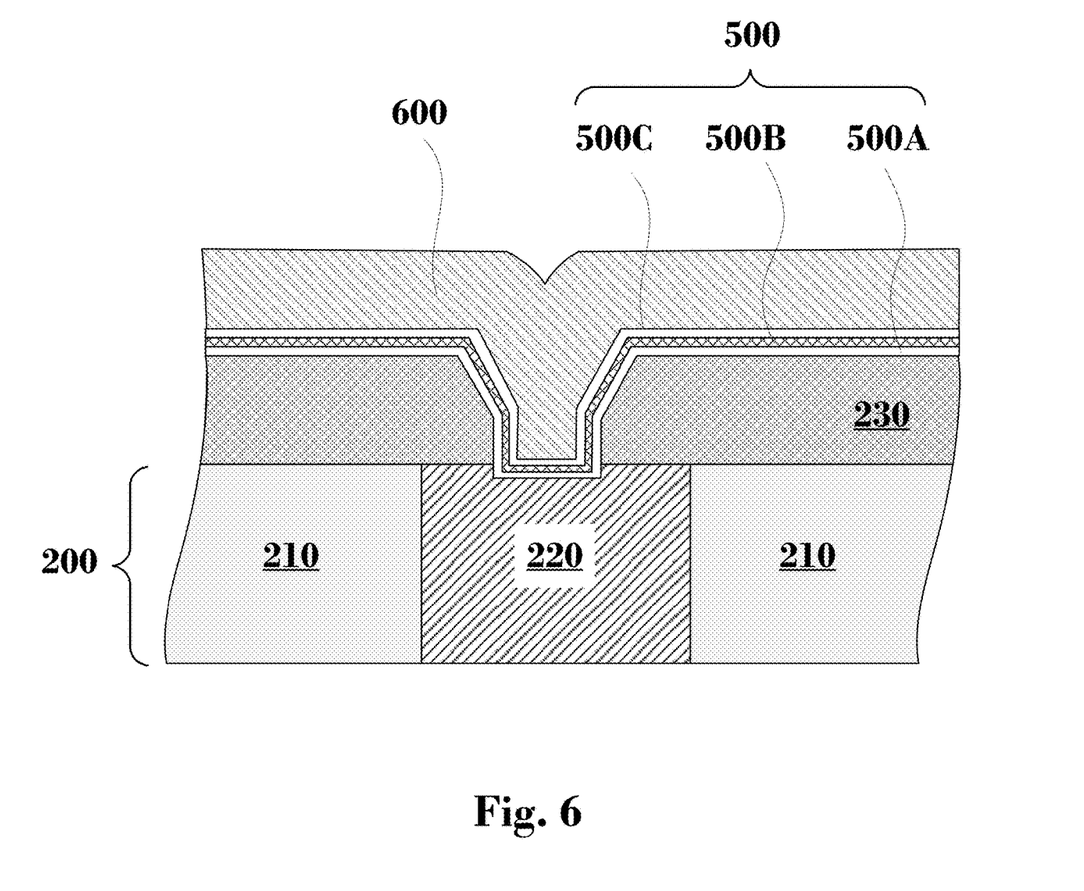
FIG. 6 illustrates a cross-sectional view of a partially formed bottom electrode of a resistive random access memory structure over an interconnect layer, according to some embodiments.

Referring to FIG. 1, method 100 continues with operation 130, where a barrier stack is deposited over the bottom and sidewall surfaces of opening 400. Referring to FIG. 5, stack 500 can be deposited over dielectric 230 so that it covers the bottom surface of opening 400 (e.g., the exposed conductive structure 220) and the sidewall surfaces of opening 400. By way of example and not limitation, stack 500 can also extend over the top surface of dielectric 230. According to some embodiments, stack 500 includes a middle layer 500B disposed between a bottom layer 500A and a top layer 500C, as shown in FIG. 5. Each of the layers in stack 500 (e.g., bottom layer 500A, middle layer 500B, and top layer 500C) can be deposited in-situ (e.g., without a vacuum break). By way of example and not limitation, the layers in stack 500 can be deposited successively. For example, bottom layer 500A can be blanket deposited first, for example, over the exposed surfaces of dielectric 230 (e.g., over the sidewall surfaces of opening 400 and top surface of dielectric 230) and over the exposed conductive structure 220 (e.g., over the exposed top surface of conductive structure 220). Subsequently, middle layer 500B can be deposited over bottom layer 500A, and top layer 500C can be deposited over middle layer 500B. In some embodiments, middle layer 500B can include a metal, such as tantalum (Ta) or titanium (Ti). Additionally, bottom layer 500A and top layer 500C can include a metal nitride that corresponds to the metal that was used in the deposition of middle layer 500B. For example, stack 500 can include a TiN/Ti/TiN tri-layer or a TaN/Ta/TaN tri-layer, according to some embodiments.

In some embodiments, each layer of stack 500 (e.g., bottom layer 500A, middle layer 500B, and top layer 500C) can be deposited with a physical vapor deposition process (e.g., a sputtering process). For example, in the case of a TiN/Ti/TiN stack 500, bottom and top layers 500A and 500C (e.g., TiN) can be deposited by sputtering off a titanium target (e.g., with an argon plasma) in the presence of nitrogen gas or a nitrogen plasma, in the presence of ammonia gas or an ammonia plasma, or combinations thereof. Accordingly, middle layer 500B (e.g., Ti metal) can be deposited by sputtering off the titanium target (e.g., with an argon plasma) without flowing a gas (e.g., nitrogen or ammonia) or forming any plasmas (e.g., nitrogen or ammonia) during the deposition process. In the case of a TaN/Ta/TaN stack 500, bottom and top layers 500A and 500C (e.g., TaN) can be deposited by sputtering off a tantalum target (e.g., with an argon plasma) in the presence of nitrogen gas or a nitrogen plasma, in the presence of ammonia gas or an ammonia plasma, or combinations thereof. Accordingly, middle layer 500B (e.g., Ta metal), can be deposited by sputtering off the tantalum target (e.g., with an argon plasma) without flowing a gases (e.g., nitrogen or ammonia) or forming any plasmas (e.g., nitrogen or ammonia) during the deposition process. It is noted that the aforementioned examples of deposition methods and gases are not limiting, and other gases or additional gases, plasmas, or deposition methods can be used to deposit layers 500A, 500B, and 500C of stack 500. These other gases, plasmas and deposition methods are within the spirit and the scope of this disclosure.

The as-deposited thickness of bottom layer 500A can range from about 2 nm to about 10 nm (e.g., from about 2 nm to about 5 nm, from about 4 nm to about 8 nm, from about 7 nm to about 10 nm). The as-deposited thickness of middle layer 500B can range from about 1 nm to about 10 nm (e.g., from about 1 nm to 5 nm, from about 3 nm to about 7 nm, from about 6 nm to about 10 nm). The as-deposited thickness of top layer 500C can range from about 2 nm to about 10 nm (e.g., from about 2 nm to about 5 nm, from about 4 nm to about 8 nm, from about 7 nm to about 10 nm). Consequently, the total thickness of stack 500 can range from about 5 nm to about 30 nm depending on the individual thickness of each layer (e.g., 500A, 500B, and 500C). If the thicknesses of layers 500A 500C, and 500B are each below 1 nm respectively, stack 500 can exhibit poor barrier performance against, for example, copper diffusion from conductive structure 220. On the other hand, if the thickness of layers 500A, 500C and 500B are each above 10 nm, stack 500 can exhibit high resistivity (e.g., greater than 500 $\mu\Omega \cdot cm$), which is undesirable.

In some embodiments, stack 500 is a metal blocking stack that prevents out-diffusion of a metal, such as copper, from conductive structure 220. The advantage of a stack, as opposed to a single layer, is that the stack can provide improved metal barrier properties against copper out-diffusion and have a lower resistivity value (e.g., between about 10 $\mu$106 ·cm and about 500 $\mu\Omega \cdot cm$). For example, increasing the thickness of a single layer to improve the layer's barrier performance can also increase its resistivity. On the other hand, a stack with a metal layer sandwiched between two metal nitride layers results in a lower resistivity that a single barrier layer, while improving barrier performance against copper out-diffusion. Therefore, for a single barrier layer to exhibit similar (or the same) barrier performance as a stack, the single barrier layer would be thicker and more resistive than the stack (e.g., have a resistivity greater than about 500 $\mu\Omega \cdot cm$).

In referring to FIG. 1, method 100 continues with operation 140, where a conductive material is deposited over stack 500 to fill opening 400 and to form a bottom electrode of a RRAM structure. By way of example and not limitation, and referring to FIG. 6, conductive material 600 is deposited over stack 500 to fill opening 400. In some embodiments, conductive material 600 includes a metal, such as gold (Au), platinum (Pt), ruthenium (Ru), iridium (Ir), titanium (Ti), aluminum (Al), copper (Cu), tantalum (Ta), tungsten (W); alloys such as iridium-tantalum alloy (Ir—Ta); oxides, such as indium-tin oxide (ITO); or combinations thereof. In some embodiments, material 600 includes any alloys, oxides, nitrides, fluorides, carbides, borides or silicides of the aforementioned metals, such as tantalum nitride (TaN), titanium nitride (TiN), titanium aluminum nitride (TiAlN), titanium-tungsten alloy (TiW), or combinations thereof. Further, the thickness of conductive material 600 can range from about 2 nm to about 30 nm. By way of example and not limitation, material 600 can be deposited by physical vapor deposition (e.g., sputtering), metal-organic chemical vapor deposition (MOCVD), or chemical vapor deposition.

Figure 7:
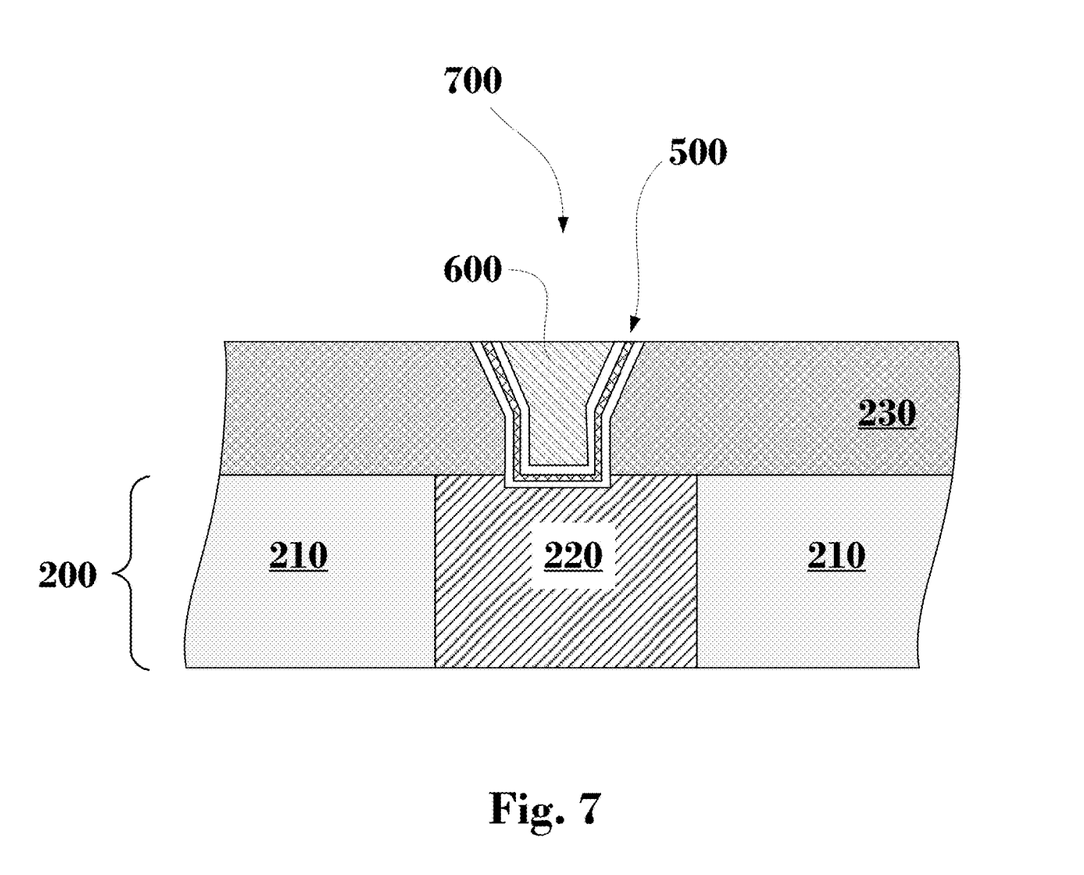
FIG. 7 illustrates a cross-sectional view of a barrier stack interposed between a bottom electrode material of a random-access memory structure and a conductive structure of an underlying layer, according to some embodiments.
Figure 8:
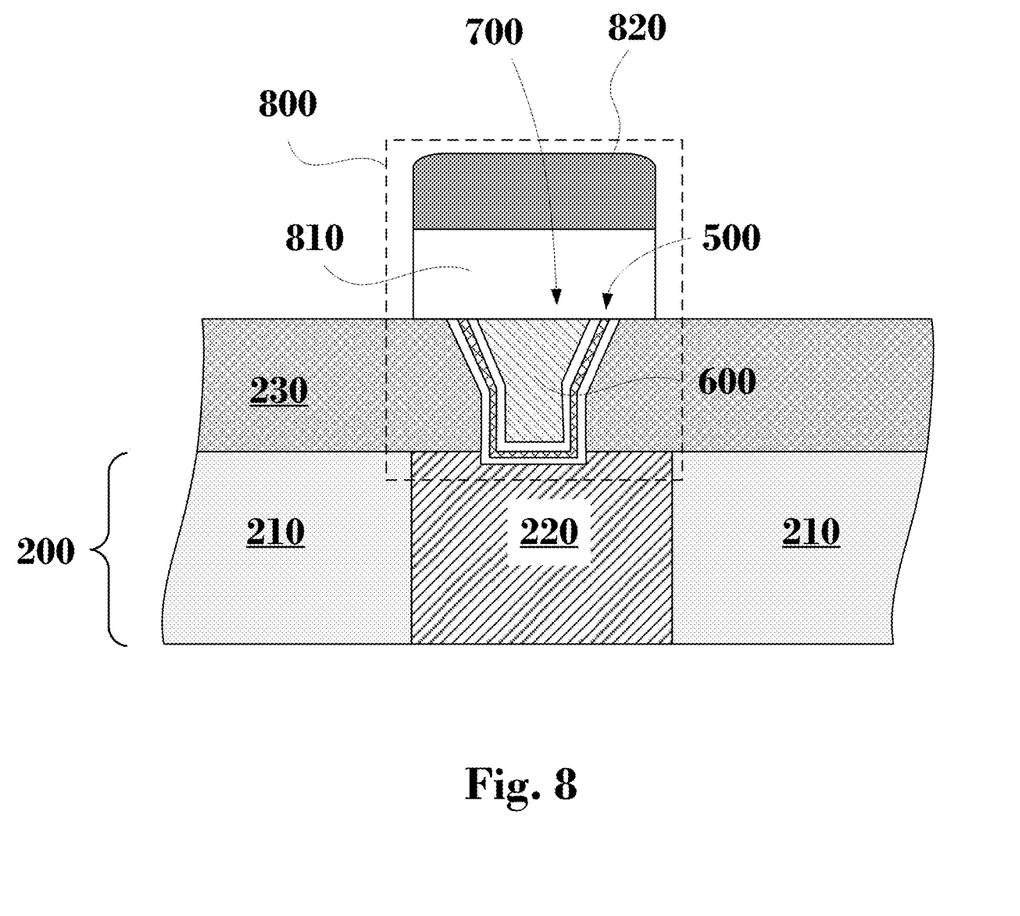
FIG. 8 illustrates a cross-sectional view of a resistive random access memory (RRAM) structure with a barrier stack interposed between a bottom electrode material of the RRAM structure and a conductive structure of an underlying layer, according to some embodiments.

Subsequently, a chemical mechanical planarization (CMP) process can polish and remove conductive material 600 and stack 500 over dielectric 230. In some embodiments, the CMP process can be terminated when dielectric 230 is exposed, as shown in FIG. 7, so that the top surfaces of dielectric 230, stack 500, and conductive material 600 can be substantially co-planar. According to some embodiments, stack 500 and conductive material 600 shown in FIG. 7 form a bottom electrode 700 of a RRAM structure 800 shown in FIG. 8.

Referring to FIG. 1, method 100 continues with operation 150 and the formation of the RRAM structure over bottom electrode 700. In some embodiments, and referring to FIG. 8, RRAM structure 800 includes bottom electrode 700, a resistance-switching layer 810 formed on bottom electrode 700, and a top electrode 820 that is disposed on resistance-switching layer 810. In some embodiments, resistance-switching layer 810 is a composite material that includes a metal, silicon, and oxygen. By way of example and not limitation, the thickness of resistance-switching layer 810 can range from about 1 nm to about 100 nm. The metal in resistance-switching layer 810 can include tungsten (W), tantalum (Ta), titanium (Ti), nickel (Ni), cobalt (Co), hafnium (Hf), ruthenium (Ru), zirconium (Zr), zinc (Zn), iron (Fe), tin (Sn), aluminum (Al), copper (Cu), silver (Ag), molybdenum (Mo), chrome (Cr), or combinations thereof. By way of example and not limitation, top electrode 820 can include a metal, such as gold (Au), platinum (Pt), ruthenium (Ru), iridium (Ir), titanium (Ti), aluminum (Al), copper (Cu), tantalum (Ta), tungsten (W); alloys such as iridium-tantalum alloy (Ir—Ta); oxides, such as indium-tin oxide (ITO); or combinations thereof. In some embodiments, top electrode 820 includes any alloys, oxides, nitrides, fluorides, carbides, borides or silicides of the aforementioned metals, such as tantalum nitride (TaN), titanium nitride (TiN), titanium aluminum nitride (TiAlN), titanium-tungsten alloy (TiW), or combinations thereof. In some embodiments, the thickness of top electrode 820 can range between about 5 nm and about 500 nm. By way of example and not limitation, material 820 can be deposited by physical vapor deposition (e.g., sputtering), metal-organic chemical vapor deposition (MOCVD), or chemical vapor deposition.

Figure 9:
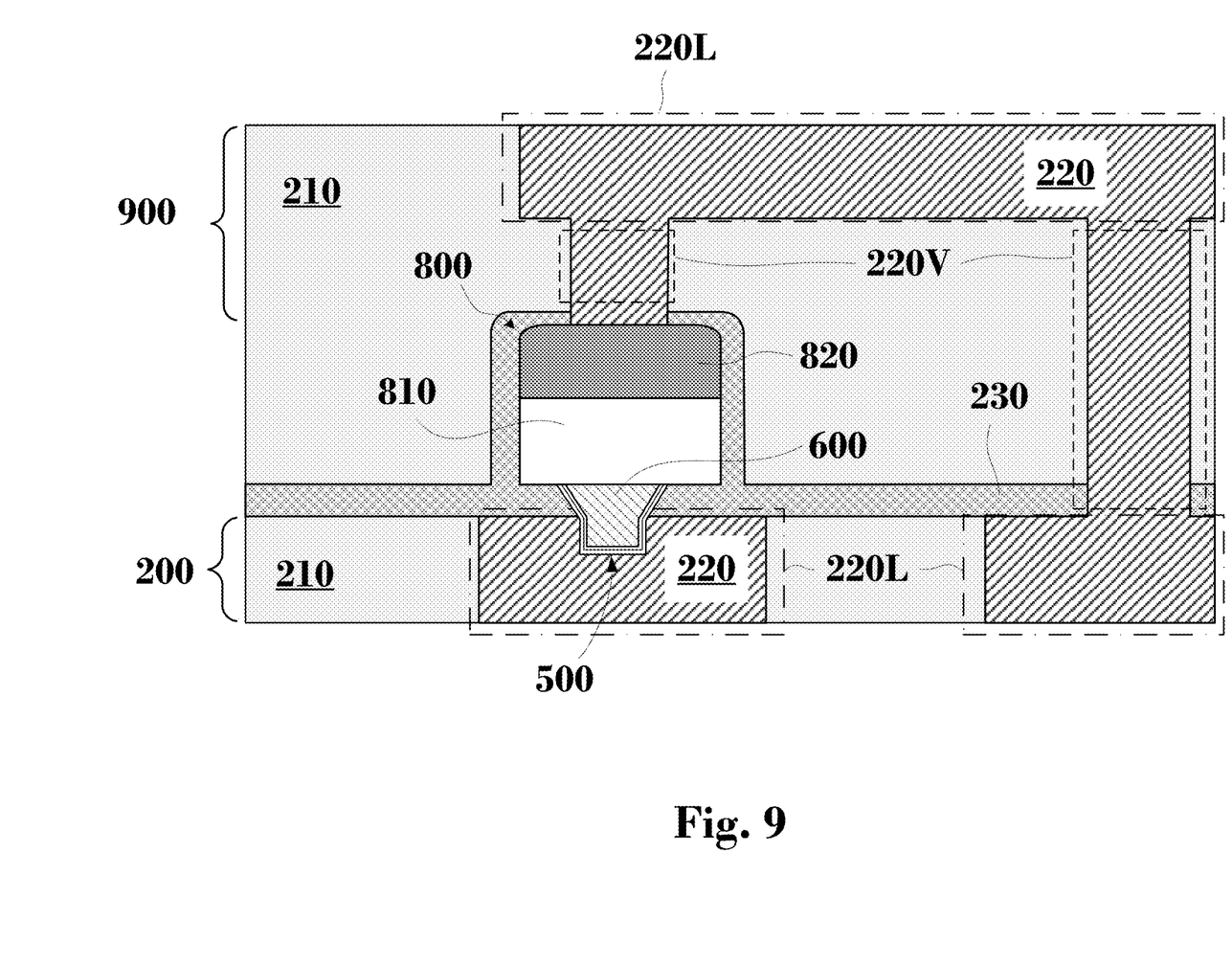
FIG. 9 illustrates a cross-sectional view of a resistive random access memory structure disposed between two layers, according to some embodiments.

FIG. 9 is a partial cross-sectional view of two layers 200 and 900 with conductive structure(s) 220, and RRAM structure 800 therebetween. As discussed above, RRAM structure 800 includes a bottom electrode with a metal barrier stack 500 and conductive material 600. In some embodiments, conductive structures 220 can form a metallization network that electrically connects adjacent layers across a chip; for example, as shown in FIG. 9, conductive structures 220 can vertically connect layers 200 and 900. By way of example and not limitation, conductive structures 220 can include vertical structures (e.g., vias) 220V that extend between adjacent layers 200 and 900, and lines 220L that extend laterally within each layer (e.g., within layer 200 and/or within layer 900). According to some embodiments, conductive structure 220, which connects to the bottom electrode of RRAM structure 800, can be different from the conductive structure 220 that connects to top electrode 820 of RRAM structure 800. In some embodiments, layers 200 and 900 can be BEOL metallization layers. However, this is not limiting, and depending on the chip layout, layers 200 and 900 can be MOL metallization layers. Alternatively, layers 200 and 900 can be metallization layers disposed elsewhere in the chip, where a diffusion of a metal (e.g., copper) from an underlying conductive structure 220 is a concern.

Additional layers, not shown in FIG. 9, can be formed below layer 200 and/or above layer 900. By way of example and not limitation, these additional layers can include additional conductive structures, memory structures, resistor structures, transistors, structures capacitors, other chip elements, or combinations thereof. By way of example and not limitation, these additional layers, and along with layers 200/900 and RRAM structure 800, can be disposed over a substrate. In some embodiments, the substrate can be a semiconductor wafer (e.g., a silicon wafer), a semiconductor on insulator wafer, an interposer, a transfer wafer, or a dielectric substrate (e.g., quartz). In some embodiments, more than one memory structures are possible between layers 200 and 900. Therefore, FIG. 9 may include additional RRAM structures like RRAM structure 800 or other memory structures and elements. Further, additional conductive structures may be formed between or within layers 900 and 200.

The embodiments described herein are not limited to RRAM structures and can be applied to other types of memory structures to prevent out-diffusion of a metal from an underlying conductive structure. By way of example and not limitation, the embodiments described herein can be applicable to magnetic random-access memory (MRAM) structures. More specifically, stack 500 can be deposited during the fabrication of a bottom electrode in a MRAM structure, according to the embodiments described herein.

The present disclosure is directed to RRAM structures with a bottom electrode barrier stack as opposed to a single barrier layer. According to some embodiments, the bottom electrode barrier stack includes a metal that is interposed between a pair of metal nitride layers. For example, the stack can include a tantalum nitride/tantalum/tantalum nitride tri-layer stack or a titanium nitride/titanium/titanium nitride tri-layer stack that can be deposited with a physical vapor deposition process (e.g., sputtering). According to the embodiments described herein, the bottom electrode barrier stack can be resilient to the formation of discontinuities and/or provide improved barrier properties against copper out-diffusion from underlying conductive structures, as compared to a single barrier layer. In some embodiments, the stack thickness can range from about 5 nm to about 30 nm depending on the individual thickness of each layer in the stack. For example, the thickness of the metal layer in the stack can range from about 1 nm to about 10 nm, while the thickness of each metal nitride layer in the stack can range from about 2 nm to about 10 nm. In some embodiments, the resistivity of the stack can range from about 20 $\mu\Omega\cdot$cm to about 500 $\mu\Omega\cdot$cm.

In some embodiments, a method for forming a memory structure includes disposing a dielectric material over a layer with a conductive structure and forming an opening in the dielectric material to expose a portion of the conductive structure. Further the method includes depositing a stack in the opening, where the stack includes a middle layer interposed between a bottom layer and a top layer. Additionally, the method includes depositing a conductive material over the stack to fill the opening; removing the conductive material and the stack over the dielectric layer to form a bottom electrode in the dielectric layer; disposing a resistance-switching layer over the bottom electrode; and depositing a top electrode over the resistance-switching layer. The stack, the bottom electrode, the resistance-switching layer, and the top electrode form the memory structure.

In some embodiments, a method includes disposing a dielectric layer over a conductive structure; forming an opening in the dielectric layer to expose a top surface of the conductive structure, where a top portion of the opening is tapered. The method further includes depositing a stack in the opening, where the stack includes: (i) a bottom layer that includes a metal nitride, where the bottom layer is disposed on the exposed top surface of the conductive structure and on side surfaces of the opening; (ii) a middle layer that includes a metal and is disposed on the bottom layer; and (iii) a top layer that includes a metal nitride and is disposed on the middle layer. Additionally, the method includes depositing a first conductive material over the stack to fill the opening; forming a resistance-switching layer on the conductive material; and depositing a second conductive material on the resistance-switching layer.

In some embodiments, a structure includes a memory structure over a conductive structure, where the memory structure includes: (i) a bottom electrode having a conductive material and a layer stack, where the layer stack covers a bottom surface and a side surface of the conductive material and is interposed between the conductive material and the conductive structure, and where the bottom electrode is in contact with the conductive structure; (ii) a resistance-switching layer that is disposed on the bottom electrode and opposite to the conductive structure; and (iii) a top electrode that is disposed on the resistance-switching layer. The structure further includes a first dielectric that surrounds the conductive structure, and a second dielectric that surrounds the bottom electrode of the memory structure.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory structure, comprising:
    disposing a dielectric material over a layer with a conductive structure;
    forming an opening in the dielectric material to expose a portion of the conductive structure;
    depositing a stack in the opening, wherein the stack comprises a middle layer interposed between a bottom layer and a top layer;
    depositing a conductive material over the stack to fill the opening;
    removing the conductive material and the stack over the dielectric layer to form a bottom electrode in the dielectric layer, wherein a bottom surface of the bottom electrode is below a top surface of the conductive structure;
    disposing a resistance-switching layer over the bottom electrode; and
    depositing a top electrode over the resistance-switching layer, wherein the stack, the bottom electrode, the resistance-switching layer, and the top electrode form the memory structure.

2. The method of claim 1, wherein each of the top and bottom layers of the stack comprises tantalum nitride or titanium nitride with a thickness between about 2 nm and about 10 nm.

3. The method of claim 1, wherein the middle layer of the stack comprises a metal with a thickness between about 1 nm and about 10 nm.

4. The method of claim 3, wherein the metal comprises tantalum or titanium.

5. The method of claim 1, wherein the conductive structure comprises copper or a copper alloy.

6. The method of claim 1, wherein depositing the stack comprises depositing each layer of the stack with a physical vapor deposition process.

7. The method of claim 1, wherein the stack has a thickness between about 5 nm and about 30 nm.

8. A method, comprising:
    disposing a dielectric layer over a conductive structure;
    forming an opening in the dielectric layer to expose the conductive structure, wherein a top portion of the opening is tapered and a bottom portion of the opening is embedded in the conductive structure:
    depositing a stack in the opening, wherein the stack comprises:
        a bottom layer, comprising a metal nitride, disposed on an exposed top surface of the conductive structure and on side surfaces of the opening;
        a middle layer, comprising a metal, disposed on the bottom layer; and
        a top layer, comprising the metal nitride, disposed on the middle layer; and
    depositing a first conductive material over the stack to fill the opening;
    forming a resistance-switching layer on the conductive material; and
    depositing a second conductive material on the resistance-switching layer.

9. The method of claim 8, wherein the metal nitride comprises titanium nitride or tantalum nitride.

10. The method of claim 8, wherein the metal comprises titanium or tantalum.

11. The method of claim 8, wherein the stack has a resistivity between about 20 $\mu\Omega\cdot cm$ and about 500 $\mu\Omega\cdot cm$ and a thickness between about 5 nm and about 30 nm.

12. The method of claim 8, wherein the metal nitride of the top and bottom layers and the metal in the middle layer comprise the same metal.

13. The method of claim 8, wherein the stack and the first conductive material form a bottom electrode for a resistive random-access memory structure.

14. A structure, comprising:
    a memory structure over a conductive structure, wherein the memory structure comprises:
        a bottom electrode in contact with the conductive structure and comprising a conductive material and a layer stack, wherein the layer stack is in contact with and surrounds a bottom surface and a side surface of the conductive material and is interposed between the conductive material and the conductive structure;
        a resistance-switching layer disposed on the bottom electrode and opposite to the conductive structure; and
        a top electrode disposed on the resistance-switching layer;
    a first dielectric surrounding the conductive structure; and
    a second dielectric surrounding the bottom electrode of the memory structure.

15. The structure of claim 14, wherein the layer stack comprises a metal layer interposed between metal nitride layers and having a thickness between about 5 nm and about 30 nm.

16. The structure of claim 15, wherein the metal layer comprises tantalum or titanium with a thickness between about 1 nm and about 10 nm.

17. The structure of claim 15, wherein the metal nitride layers comprise tantalum nitride or titanium nitride with a thickness between about 2 nm and about 10 run.

18. The structure of claim 15, wherein one of the metal nitride layers is in contact the conductive material.

19. The structure of claim 14, wherein the resistance-switching layer is in contact with a top surface of the conductive material and a top surface of the layer stack.

20. The structure of claim 14, wherein the bottom electrode has a tapered profile and an aspect ratio between about 0.1 and about 0.6.

* * * * *

UNITED STATES PATENT AND TRADEMARK OFFICE
CERTIFICATE OF CORRECTION

PATENT NO. : 10,720,581 B2  
APPLICATION NO. : 16/229345  
DATED : July 21, 2020  
INVENTOR(S) : Tsai et al.

Page 1 of 1

It is certified that error appears in the above-identified patent and that said Letters Patent is hereby corrected as shown below:

On the Title Page

Column 1, Item (72), in "Inventors", Line 3, please replace "Taipei" with -- Taipei City --, therefor.

In the Specification

In Column 2, Line 61, please replace "programming)" with -- programing) --, therefor.

In Column 6, Line 40, please replace "10 µ106 ·cm" with -- 10 µΩ·cm) --, therefor.

In the Claims

In Column 10, Claim 8, Line 22, please replace "structure:" with -- structure; --, therefor.

In Column 11, Claim 17, Line 10, please replace "10 run." with -- 10 nm. --, therefor.

Signed and Sealed this  
First Day of September, 2020

Andrei Iancu  
*Director of the United States Patent and Trademark Office*